(12) United States Patent
Tesson et al.

(10) Patent No.: US 10,217,671 B2
(45) Date of Patent: Feb. 26, 2019

(54) SEMICONDUCTOR DEVICE COMPRISING A SWITCH

(71) Applicant: NXP B.V., Eindhoven (NL)

(72) Inventors: Olivier Tesson, Bretteville l'Orgueilleuse (FR); Thomas Francois, Benouville (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/865,867

(22) Filed: Jan. 9, 2018

(65) Prior Publication Data

US 2018/0211882 A1 Jul. 26, 2018

(30) Foreign Application Priority Data

Jan. 24, 2017 (EP) ..................................... 17305072

(51) Int. Cl.
*H01L 29/06* (2006.01)
*H01L 29/66* (2006.01)
(Continued)

(52) U.S. Cl.
CPC ................ *H01L 21/823475* (2013.01); *H01L 21/76224* (2013.01); *H01L 23/4824* (2013.01); *H01L 29/0692* (2013.01); *H01L 29/0696* (2013.01); *H01L 29/41758* (2013.01); *H01L 29/4238* (2013.01); *H01L 29/66477* (2013.01); *H01L 29/78* (2013.01)

(58) Field of Classification Search
CPC ....... H01L 21/823475; H01L 21/76224; H01L 23/4824; H01L 29/0692; H01L 29/0696; H01L 29/41758; H01L 29/4238; H01L 29/66477; H01L 29/78
See application file for complete search history.

(56) References Cited

U.S. PATENT DOCUMENTS 9,721,844 B2 * 8/2017 Tesson ................ H01L 29/0696
2004/0206983 A1 * 10/2004 Yi ........................ H01L 23/4824
257/202

(Continued)

OTHER PUBLICATIONS

Lee, Tzung-Yin et al; "Modeling of SOI FET for RF Switch Applications"; IEEE Radio Frequency Integrated Circuits Symposium; pp. 479-482 (2010).

(Continued)

*Primary Examiner* — Mark W Tornow

(57) ABSTRACT

A semiconductor device comprising a switch and a method of making the same. The device, has a layout having one or more rectangular unit cells. Each unit cell includes a gate having a substantially cross-shaped part comprising four arms that divide the unit cell into quadrants; and a substantially loop-shaped part, wherein a center of the cross-shaped part is located inside the loop-shaped part, and wherein the loop-shaped part intersects each arm of the cross-shaped part to divide each quadrant into an inner region located inside the loop-shaped part; and an outer region located outside the loop-shaped part. Each unit cell also includes a substantially loop-shaped active region forming a source and drain of the switch. Each unit cell further includes a plurality of connection members extending over the gate, source and drain for providing electrical connections to the source and drain.

15 Claims, 8 Drawing Sheets

(51) Int. Cl.
  *H01L 29/78*    (2006.01)
  *H01L 21/762*   (2006.01)
  *H01L 23/482*   (2006.01)
  *H01L 29/417*   (2006.01)
  *H01L 29/423*   (2006.01)
  *H01L 21/8234*  (2006.01)

(56) References Cited

U.S. PATENT DOCUMENTS

2005/0189595 A1* 9/2005 Okamoto ........ H01L 21/823481
                                              257/368
2008/0157195 A1* 7/2008 Sutardja ............ H01L 21/82343
                                              257/337
2012/0306022 A1* 12/2012 Chuan ................. H01L 27/0207
                                              257/390
2016/0247880 A1   8/2016 Tesson et al.

OTHER PUBLICATIONS

Joshi, A. B. et al; "Optimized CMOS-SOI Process for High Performance RF Switches"; IEEE; 2 pages (2012).
Jaffe, Mark et al; "Improvements in SOI Technology for RF Switches"; IEEE Radio Frequency Integrated Circuits Symposium; pp. 30-32 (2015).
Rozbicki, Andrzej et al; "EM Analysis of Ka Band Multi-Throw PIN Diode MMIC Switches"; European Microwave Integrated Circuits Conference, London, UK; 4 pages (Mar. 3-4, 2016).

\* cited by examiner

SEMICONDUCTOR DEVICE COMPRISING A SWITCH

CROSS-REFERENCE TO RELATED APPLICATIONS

This application claims the priority under 35 U.S.C. § 119 of European patent application no. 17305072.5, filed Jan. 24, 2017 the contents of which are incorporated by reference herein.

FIELD OF THE INVENTION

The present disclosure relates to a semiconductor device comprising a switch.

BACKGROUND

Known RF (Radio Frequency) MOS (Metal-Oxide-Semiconductor) switches are based on a comb type layout. In this layout, the switch includes a gate that has a plurality of interconnected fingers. The fingers are interspersed with source and drain regions comprising elongate strips. Metal interconnects are provided to each source and drain region through a series of vias located at several points along each strip. Generally, the connection to the gate as made at one side of the device, at a common strip that interconnects each finger of the comb. The device may be surrounded by deep trench isolation (DTI).

Losses within such a switch may be relatively high. For instance, the isolation provided by the DTI surrounding the device does not affect substrate impedance within the device. Also, connection to the source and drain regions is relatively difficult, and can require connections having relatively high electrical resistance to be used.

Scaling of such a device is also limited to adding additional fingers to the comb or by varying the length of the fingers.

SUMMARY

Aspects of the present disclosure are set out in the accompanying independent and dependent claims. Combinations of features from the dependent claims may be combined with features of the independent claims as appropriate and not merely as explicitly set out in the claims.

According to an aspect of the present disclosure, there is provided a semiconductor device comprising a switch, the device having a layout comprising one or more rectangular unit cells, each unit cell comprising:
  a gate comprising:
    a substantially cross-shaped part comprising four arms that divide the unit cell into quadrants; and
    a substantially loop-shaped part, wherein a center of the cross-shaped part is located inside the loop-shaped part, and wherein the loop-shaped part intersects each arm of the cross-shaped part to divide each quadrant into:
      an inner region located inside the loop-shaped part; and
      an outer region located outside the loop-shaped part;
  a substantially loop-shaped active region forming a source and drain of the switch,
  wherein first and second parts of the loop-shaped active region located in respective first and second diagonally opposite quadrants of the unit cell each include an inner source region located inside the loop-shaped part of the gate and an outer drain region located on an outer side of the loop-shaped part of the gate,
  wherein third and fourth parts of the loop-shaped active region located in respective third and fourth diagonally opposite quadrants of the unit cell each include an inner drain region located inside the loop-shaped part of the gate and an outer source region located on an outer side of the loop-shaped part of the gate; and
  a plurality of connection members extending over the gate, source and drain for providing electrical connections to the source and drain.

According to another aspect of the present disclosure, there is provided a method of making a semiconductor device comprising a switch, the method comprising forming at least one rectangular unit cell of the switch by:
  providing a semiconductor substrate;
  forming a gate on the substrate, the gate comprising:
    a substantially cross-shaped part comprising four arms that divide the unit cell into quadrants; and
    a substantially loop-shaped part, wherein a center of the cross-shaped part is located inside the loop-shaped part, and wherein the loop-shaped part intersects each arm of the cross-shaped part to divide each quadrant into:
      an inner region located inside the loop-shaped part; and
      an outer region located outside the loop-shaped part;
  forming a substantially loop-shaped active region to form a source and drain of the switch;
  wherein first and second parts of the loop-shaped active region located in respective first and second diagonally opposite quadrants of the unit cell each include an inner source region located inside the loop-shaped part of the gate and an outer drain region located on an outer side of the loop-shaped part of the gate, and
  wherein third and fourth parts of the loop-shaped active region located in respective third and fourth diagonally opposite quadrants of the unit cell each include an inner drain region located inside the loop-shaped part of the gate and an outer source region located on an outer side of the loop-shaped part of the gate; and
  forming a plurality of connection members extending over the gate, source and drain for providing electrical connections to the source and drain.

The provision of a device having a layout that includes one or more rectangular unit cells may allow the device conveniently to be scaled by adding further unit cells to the layout. The unit cell includes features which may allow it to interface with any neighbouring unit cells of the device, to simplify this scaling. These features include a gate that divides the unit cell into quadrants, each quadrant having inner and outer regions that accommodate inner and outer regions of the source and drain. Electrical connections to the gate, source and drain are provided by connection members that extend over the gate, source and drain.

In some embodiments, each unit cell may further include trench isolation. For example, the trench isolation may be deep trench isolation (DTI). The trench isolation may increase the impedance of the substrate, for improving the performance of the switch. The location of the trench isolation within the unit cell (as opposed to isolation that simply surrounds the overall device) may improve the impedance of the substrate compared to devices having the comb type layout as described above.

The trench isolation of each unit cell may include an island located inside the loop-shaped active region, beneath the center of the cross-shaped part of the gate. This isolation of trench isolation may act electrically to isolate from each other the inner source and drain regions located in the inner regions of the quadrants of the unit cell.

The trench isolation of each unit cell may include a loop-shaped trench extending around a periphery of the unit cell completely to enclose the loop-shaped active region of the unit cell when viewed from above a surface on which the unit cell is located. The loop-shaped trench may electrically isolate the active region of each unit cell from other parts of the device (e.g. from the active regions of other unit cells of the device).

Each unit cell may have an inner source connection member that extends diagonally across the unit cell electrically to interconnect the inner source regions of the loop-shaped active region. Each unit cell may have an inner drain connection member that extends diagonally across the unit cell electrically to interconnect the inner drain regions of the loop-shaped active region. These source and drain connection members may cross each other (e.g. orthogonally) at a center of the unit cell when viewed from above a surface on which the unit cell is located. This arrangement may reduce capacitive coupling between the source and drain connection members that connect together the inner source and drain regions of the unit cell.

Each unit cell may have a source connection member that extends across the substantially loop-shaped part of the gate when viewed from above a surface on which the unit cell is located, to connect an inner source region of the unit cell to an outer source region of the unit cell. Each unit cell may have a drain connection member that extends across the substantially loop-shaped part of the gate when viewed from above a surface on which the unit cell is located, to connect an inner drain region of the unit cell to an outer drain region of the unit cell. These source and drain connection members may allow the inner source/drain regions of the unit cell to be interconnected with the outer source/drain regions of the unit cell, despite the fact that the loop-shaped part of the gate physically separates the inner source regions from the outer source regions and the inner drain regions from the outer drain regions.

In one embodiment, the connection members may conveniently be formed in a metallisation stack that is located above the gate, source and drain.

The device may include a plurality of unit cells arranged in an array. For instance, the array may comprise a square or rectangular array.

The arms of the gate of each unit cell may connect with corresponding arms of the gates of neighbouring unit cells in the array at the edges of each unit cell. In a device that includes a plurality of unit cells arranged in an array, the arms of the various unit cells may combine to form a grid, conveniently allowing the gate voltage to be distributed within the array, and allowing electrical connections to be made to the grid at the edges of the array.

The plurality of connection members of each unit cell may connect to connection members of neighbouring unit cells at the edges of the unit cells when viewed from above a surface on which the unit cells are located. This may conveniently allow the source/drain voltages to be distributed within the array, and may allow electrical connections to be made to the source/drain connection members at the edges of the array. Source connection members and/or drain connection members of each unit cell connect with source connection members and/or drain connection members of neighbouring unit cells at the corners of the unit cells.

In some embodiments, nearest neighbour unit cells of the array may be rotated with respect to each other by ninety degrees when viewed from above a surface on which the unit cells are located. For instance, this may allow correct connection of the connection members (e.g. source and/or drain connection members) that extend across each unit cell to be made, for instance at the edge and/or corners of the unit cells.

In accordance with an embodiment of this invention, each unit cell may be square. It is envisaged that some embodiments may include oblong unit cells.

In one embodiment, the device is a Radio Frequency Metal Oxide Semiconductor (RF MOS) switch.

According to a further aspect of the invention, there is provided a Radio Frequency (RF) circuit comprising a semiconductor device of the kind described above.

For the purposes of this application, radio frequency (RF) signals may be considered to be signals in the frequency range 1 GHz≤f≤40 GHz. For instance, the signals may be in the bands used for WLAN communications (e.g. 2.4-2.5 GHz & 4.9-5.92 GHz). In other examples, the RF signals may be in one of the following IEEE bands: L band=1-2 GHz, S band=2-4 GHz, C band=4-8 GHz, X band=8-12 GHz, $K_u$ band=12-18 GHz, K band=18-27 GHz, $K_a$ band=26.5-40 GHz.

Embodiments of this invention may, for instance, be used in LTE/WLAN integrated circuits (ICs), such as those incorporating low noise amplifiers and a switch, front end integrated circuits ICs, and in 5G related IC's at both 28 and 39 GHz.

BRIEF DESCRIPTION OF THE DRAWINGS

Embodiments of this disclosure will be described hereinafter, by way of example only, with reference to the accompanying drawings in which like reference signs relate to like elements and in which.

DETAILED DESCRIPTION

Embodiments of this disclosure are described in the following with reference to the accompanying drawings.

Embodiments of the present disclosure may provide a semiconductor device that includes a switch. The device has a layout that comprises one or more unit cells. The unit cells are generally rectangular (a quadrilateral having four right angled corners) and may, for example, be square or oblong. The provision of unit cells having a rectangular shape according to an embodiment of this invention may allow the device to be scaled by adding additional unit cells. In some embodiments, the unit cells may be provided in an array such as a rectangular, oblong or square array, according to the shape of the unit cells used. The unit cells may generally have a shape that allows them to tessellate within the array, whereby connection members provided in the unit cells may conveniently interconnect at the edges of the unit cells with the connection members of neighbouring unit cells.

Figure 5:
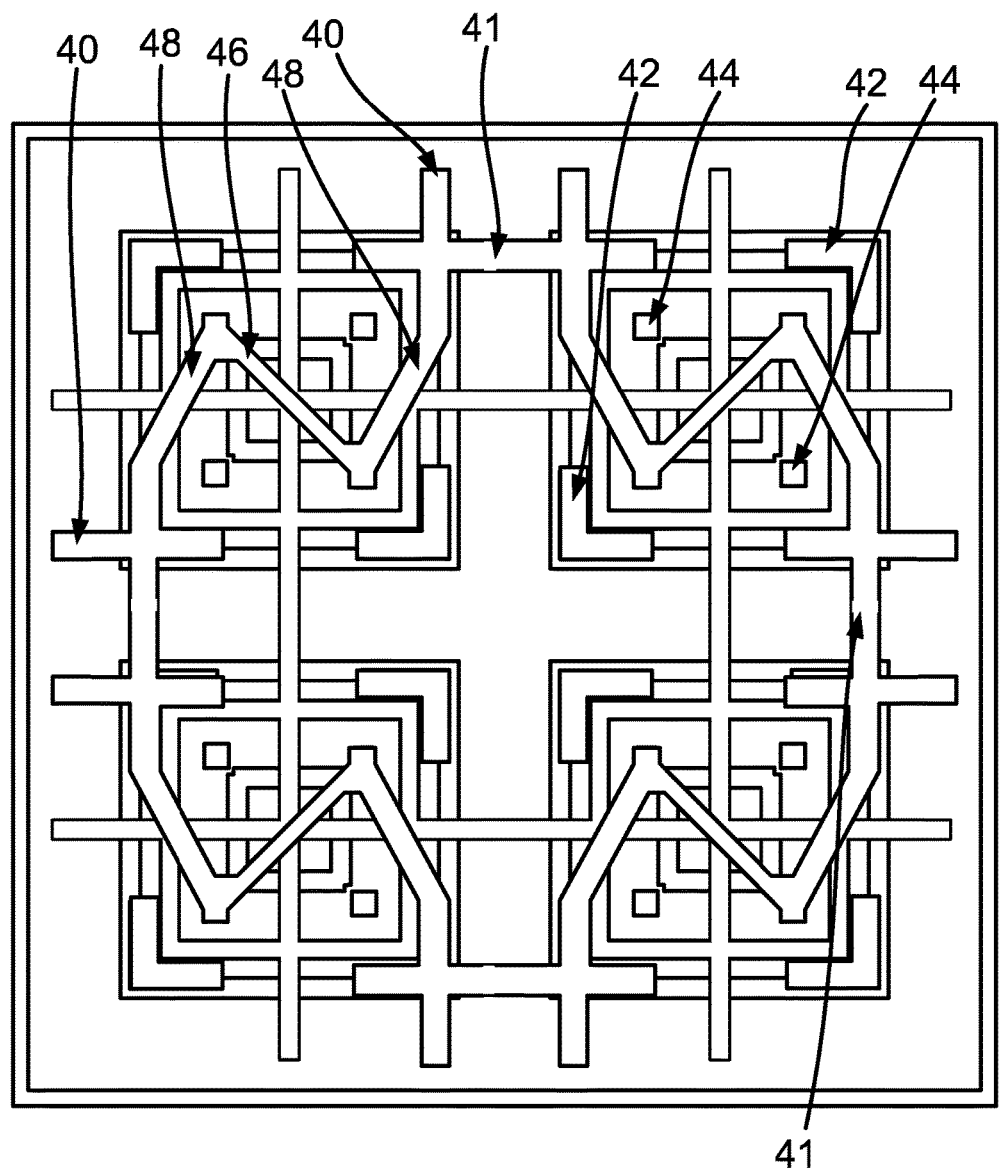
Figure 6:
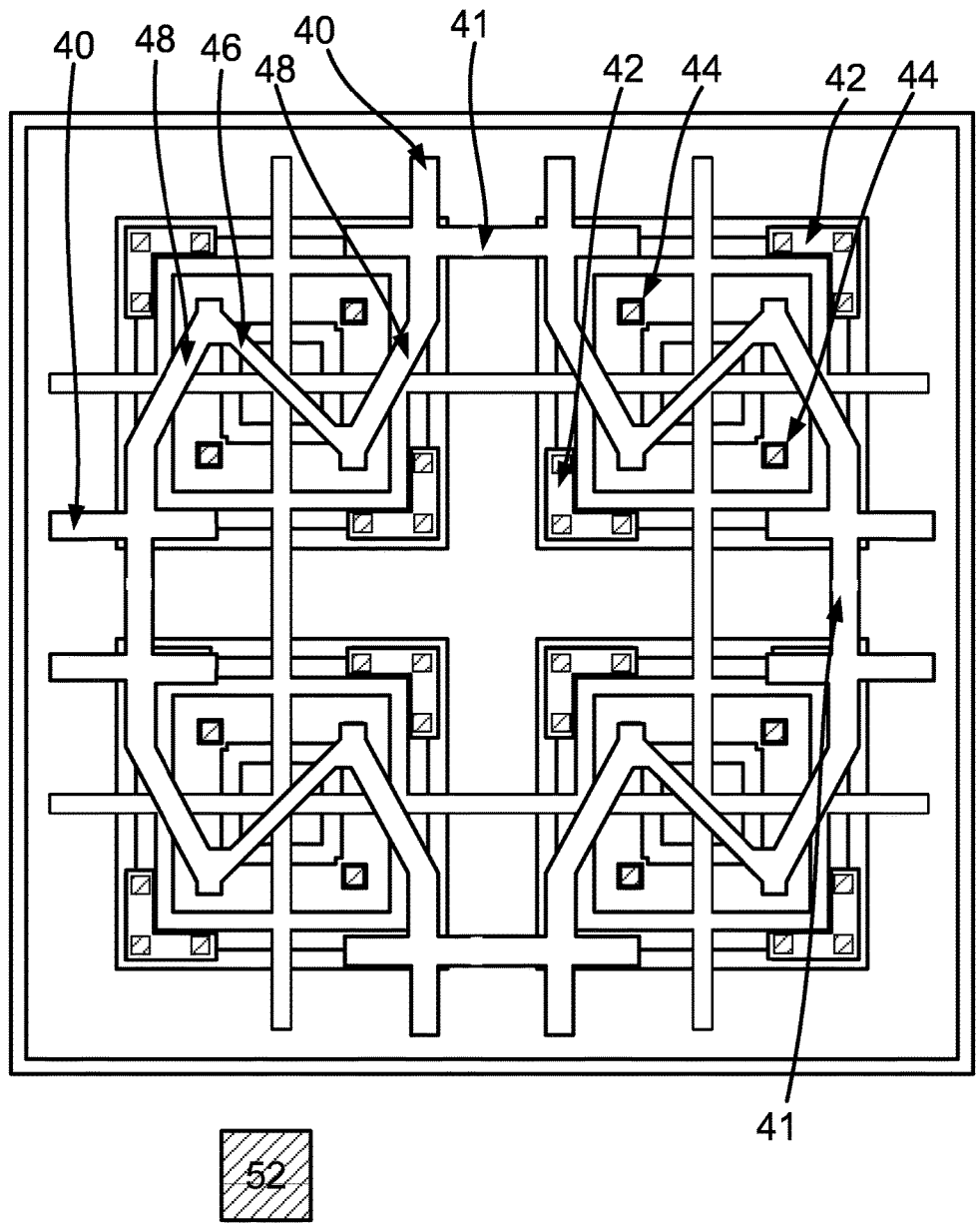
Figure 7:
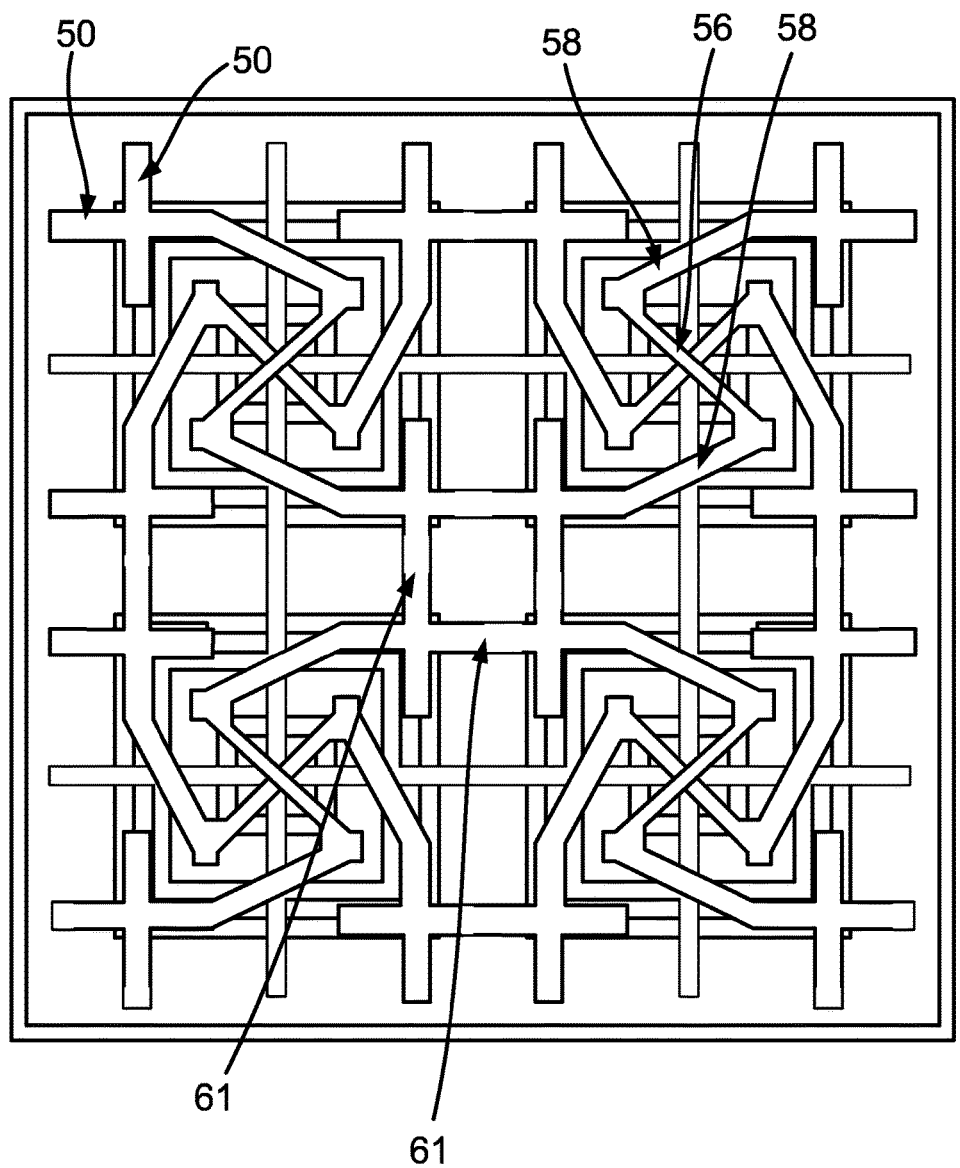

FIGS. 1 to 7 show a number of steps in the manufacture of a semiconductor switch device according to an embodiment of the present disclosure, with FIG. 7 showing the finished device. The various stages of this example method will be described below.

Figure 1:
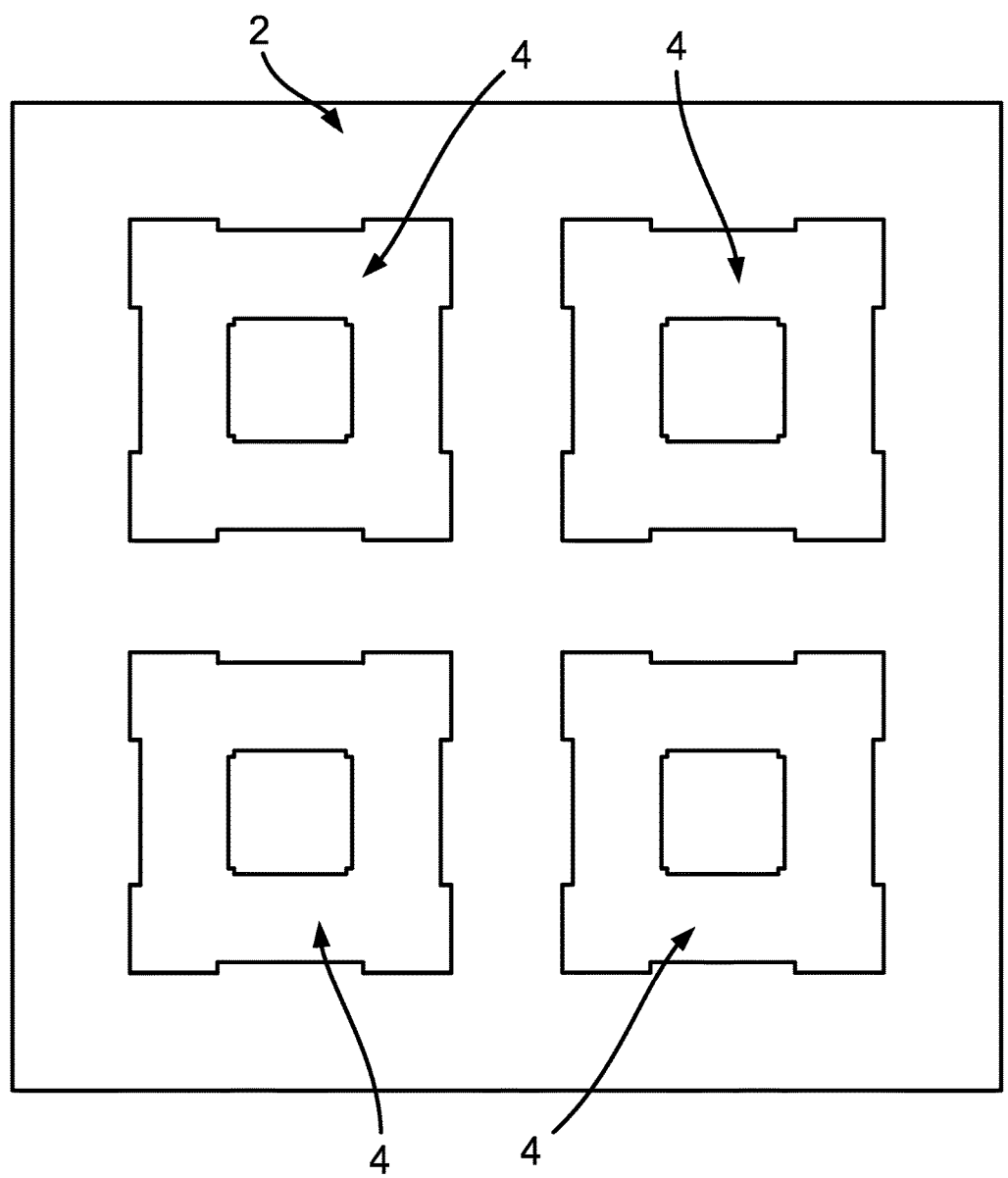
FIGS. 1 to 7 show a number of steps in the manufacture of a semiconductor switch device according to an embodiment of the present disclosure, with FIG. 7 showing the finished device.

In a first stage, shown in FIG. 1, there is provided a semiconductor substrate. The substrate may, for instance, be a silicon substrate. The substrate has a major surface 2. It will be appreciated that the views in FIGS. 1-8 are from above the substrate, looking down onto the major surface 2.

The semiconductor switch device includes one or more unit cells. Each unit cell is rectangular, and the unit cells may be arranged in a rectangular array. In the present example, the semiconductor switch device includes four unit cells, which are square. The unit cells in this example are provided in a square array.

As shown in FIG. 1, for each unit cell in the array, there may be formed a substantially loop-shaped active region 4. As will be described below, each loop-shaped active region 4 will form will form the source and drain regions of the device. The loops may have a shape corresponding to the overall shape of each unit cell. For instance, each loop-shaped active region 4 may be substantially rectangular. In the present example, each loop-shaped active region 4 is substantially square.

As can be seen in FIG. 1, the thickness of each loop-shaped active region 4 may vary at certain locations around the loop. For instance, in the present example, the corners of each rectangular (square) loop-shaped active region 4 are slightly enlarged. The enlarged parts of the loops may allow connections to overlying features of a metallisation stack to be implemented by providing extra space for metal filled vias to connect to the surface of the active regions 4.

The active regions 4 may be formed using ion implantation through appropriately patterned mask(s), followed by diffusion of the implanted ions to activate them, as is known in the art. The implanted ions may, for instance comprise Boron (in the case of an NMOS based switch), or Phosphorous (in the case of a PMOS based switch).

Figure 2:
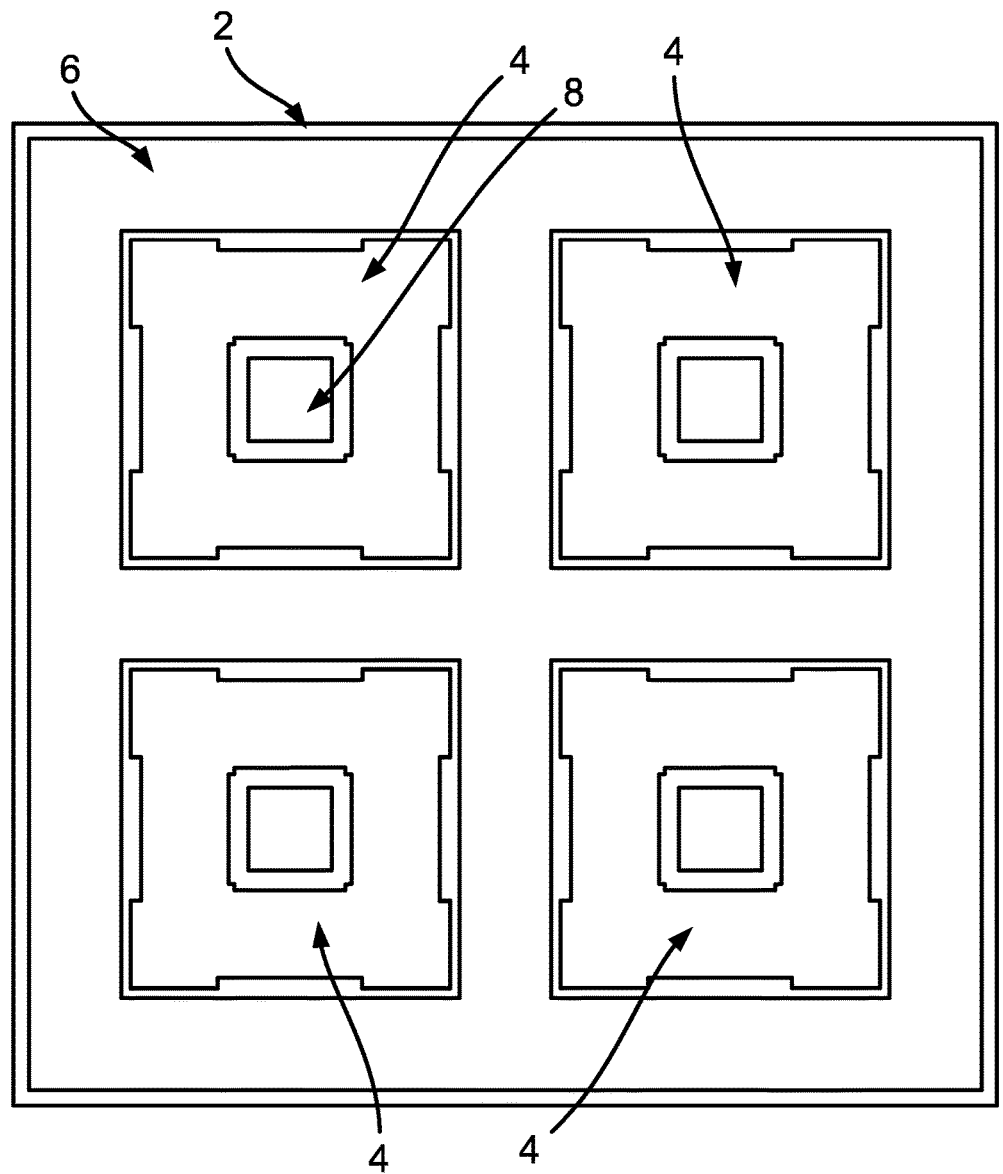

A next stage is shown in FIG. 2. In this stage, each unit cell of the device may be provided with isolation regions.

These isolation region(s) of each unit cell may include a loop-shaped isolation region 6 extending around a periphery of the unit cell completely to enclose the loop-shaped active region 4 of that unit cell. As with the loop-shaped active regions 4, the loop-shaped isolation regions 6 may have a shape corresponding to the overall shape of each unit cell. For instance, each loop-shaped isolation regions 6 may be substantially rectangular. In the present example, each loop-shaped isolation regions 6 is substantially square. As can be seen in FIG. 2, when the device includes a plurality of unit cells arranged in an array, neighboring loop-shaped isolation regions 6 in the array may adjoin each other to form a grid.

The isolation region(s) of each unit cell may include an island 8 located inside the loop-shaped active region 4 of that unit cell. The islands 8 may have a shape corresponding to the overall shape of each unit cell. For instance, island 8 may be substantially rectangular. In the present example, each island 8 is substantially square.

The isolation region(s) of each unit cell may comprise trenches filled with non-conductive material (for example, Deep Trench Isolation (DTI)). These trenches may be formed by etching into the major surface 2 of the substrate through appropriately patterned mask(s), and then depositing a dielectric into the trenches. In the present example, the trenches are formed using Deep Reactive Ion Etching (DRIE), and are filled with undoped polysilicon. Typically, the trenches extend further into the substrate that the dopants of the loop-shaped active regions 4.

The isolation region(s) of the device act to break up the regions of the substrate located in between the active regions 4, thereby increase the impedance of the substrate, for improving the performance of the switch. The positioning of the isolation regions within and around the unit cells of the array (as opposed to isolation regions that simply surround the overall device) may improve the impedance of the substrate compared to devices having the comb type layout mentioned previously.

The loop-shaped isolation regions 6 extending around a peripheries of the unit cells can electrically isolate the active region 4 of each unit cell from other parts of the device (e.g. from the active regions 4 of other unit cells of the device. The islands 8 located inside the loop-shaped active region 4 of each unit cell may electrically isolate from each other the inner source regions 22 and the inner drain regions 20 to be described below.

Figure 3:
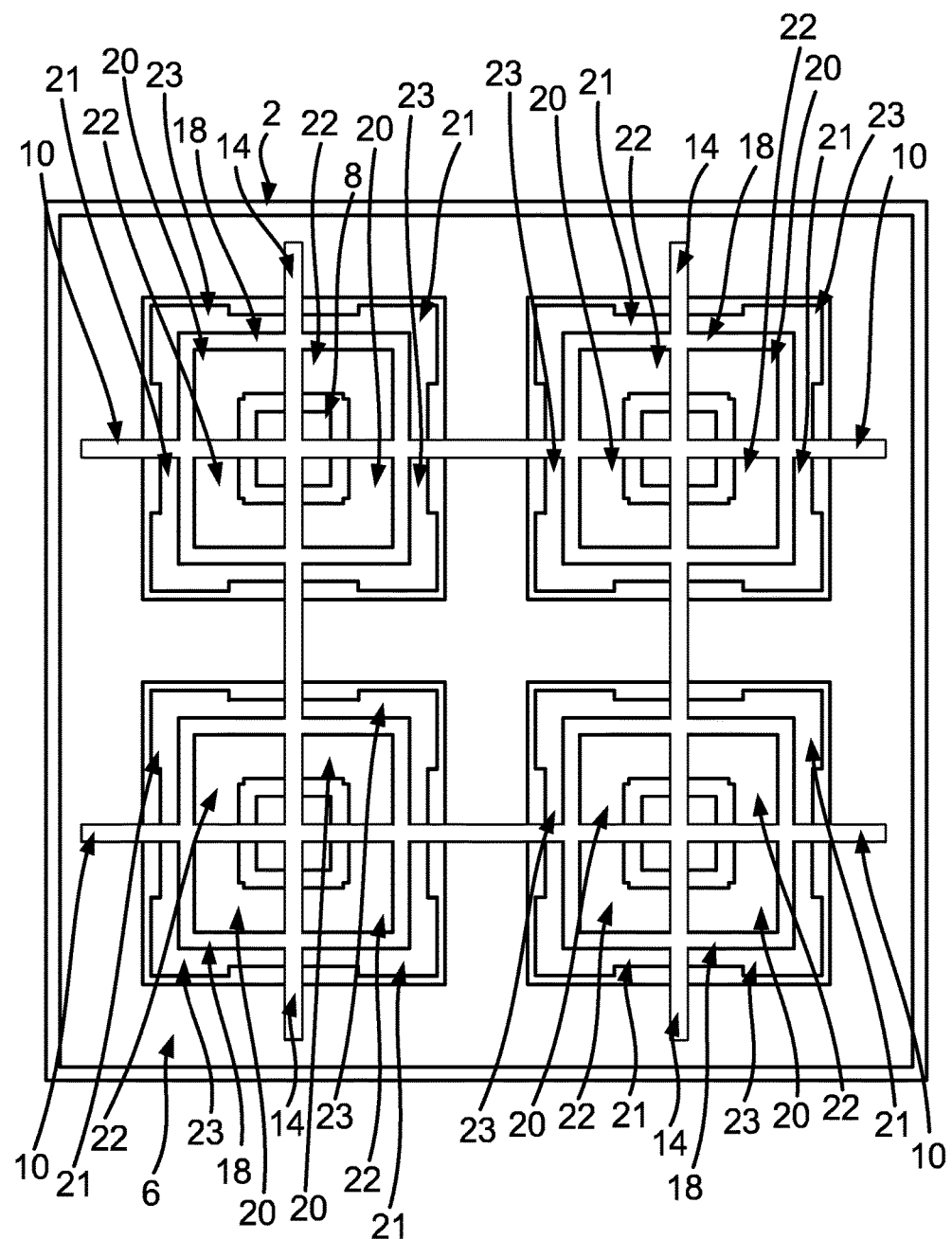

A next stage is shown in FIG. 3. In this stage, each unit cell of the device may be provided with a gate. The gate acts to divide up the loop-shaped active region 4 into a number of separate source and drain regions, to be described below. The gate may be formed by depositing and patterning a gate dielectric (e.g. silicon oxide) and a gate electrode material (e.g. doped polysilicon) on the major surface 2 of the semiconductor substrate. In advanced CMOS technologies, it is envisaged that a metal gate may be used.

The gate of each unit cell may include a substantially cross-shaped part comprising four arms. The arms of each unit cell may include two arms 10, which extend across the major surface of the semiconductor substrate in a first direction and two arms 14, which extend across the major surface of the semiconductor substrate in a second direction. The first direction may be orthogonal the second direction. The arms 10, 14 of the cross-shaped part of the gate of each unit cell may meet each other at the center of the unit cell.

As shown in FIG. 3, in examples comprising a plurality of unit cells arranged in an array, the arms 10 of the gate of each unit cell may connect with corresponding arms 10 of the gates of neighbouring unit cells in the array at the edges of each unit cell. Similarly, the arms 14 of the gate of each unit cell may connect with corresponding arms 14 of the gates of neighbouring unit cells in the array at the edges of each unit cell. In a device that includes a plurality of unit cells arranged in an array, the arms of the various unit cells may thus combine to form a grid, conveniently allowing the gate voltage to be distributed within the array, and allowing electrical connections to be made to the grid at the edges of the array. Note that the shape of the grid may match the layout of the array. For instance, the grid may be a rectangular grid. In the present example, the grid formed by the interconnections arms 10, 14 of the gate is a square grid.

The arms 10, 14 of the cross-shaped part of the gate of each unit cell divide that unit cell into quadrants. Each quadrant includes a source region and a drain region. Accordingly, in the present example, the source of each unit cell includes four source regions (one in each quadrant) and four drain regions (again, one in each quadrant).

The gate of each unit cell also includes a substantially loop-shaped part 18. As with the loop-shaped active regions 4, the loop-shaped part 18 of the gate of each unit cell may have a shape corresponding to the overall shape of that unit cell. For instance, each loop-shaped part 18 of the gate may be substantially rectangular. In the present example, each loop-shaped part 18 of the gate is substantially square.

As can be seen in FIG. 3, the loop-shaped part 18 of the gate of each unit cell intersects each arm 10, 14 of the cross-shaped part of the gate of that unit cell. This arrangement of the loop-shaped part 18 of the gate of each unit cell divides each quadrant into an inner region, which is located inside the loop-shaped part 18, and an outer region, which is located outside the loop-shaped part 18. The source region of each quadrant is located in either the inner region or the outer region of that quadrant, while the drain region of each quadrant is located in the other region of the inner region or the outer region of that quadrant, on the opposite side of the loop-shaped part 18 of the gate. In particular:

- first and second parts of the loop-shaped active region 4 located in respective first and second diagonally opposite quadrants of each unit cell each include an inner source region 22 located inside the loop-shaped part 18 of the gate and an outer drain region 21 located on an outer side of the loop-shaped part 18 of the gate; and
- third and fourth parts of the loop-shaped active region 4 located in respective third and fourth diagonally opposite quadrants of each unit cell each include an inner drain region 20 located inside the loop-shaped part 18 of the gate and an outer source region 23 located on an outer side of the loop-shaped part 18 of the gate.

Figure 8:
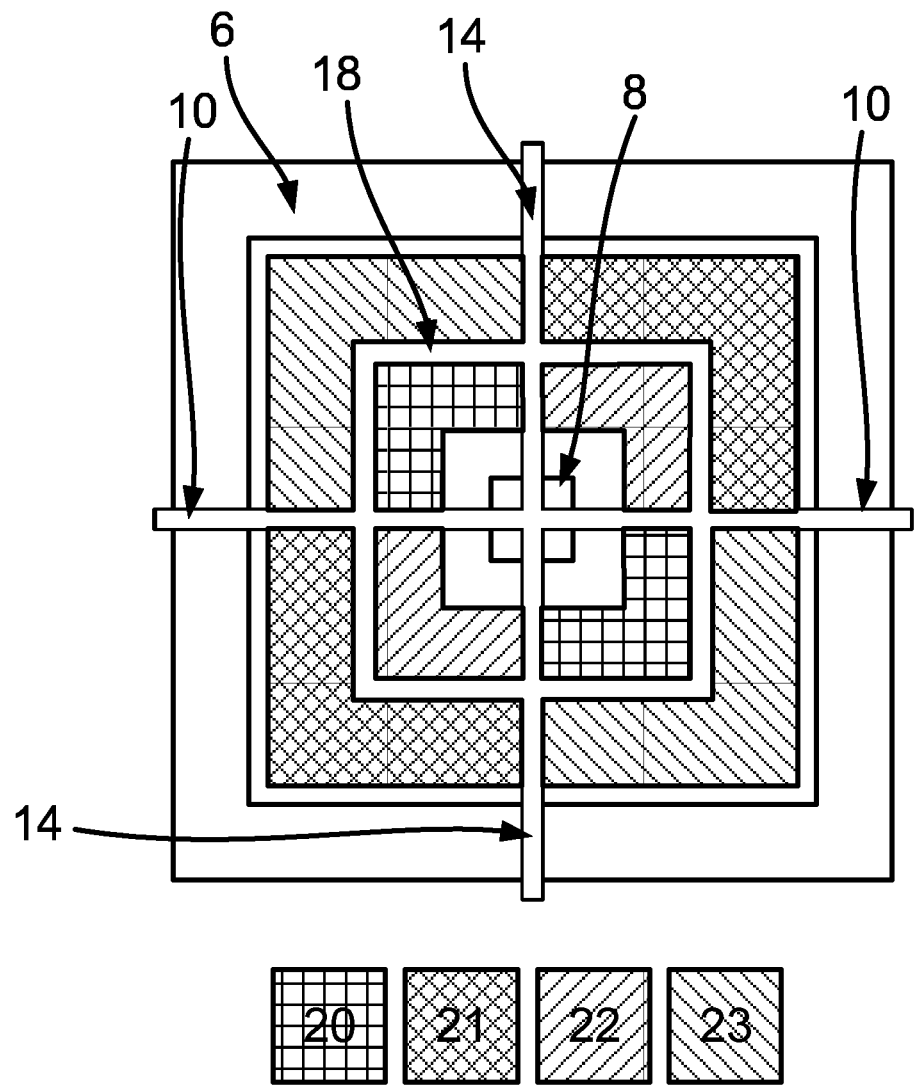
FIG. 8 schematically illustrates the locations of the source and drain regions and isolation regions in a semiconductor switch device according to an embodiment of the present disclosure.

With reference to FIG. 8, which schematically illustrates the locations of the source regions and drain regions in a unit cell of a device according to an embodiment of the present disclosure, the above described arrangement of the arms 10, 14 of the cross-shaped part and the loop-shaped part 18 of the gate of each unit cell can form an arrangement of source regions and drain regions in which:

- each inner source region 22 is separated from an outer drain region 21 in the same quadrant by the loop-shaped part 18 of the gate in that quadrant;
- each inner source region 22 is separated from the inner drain regions 20 in the two nearest neighbour quadrants of that unit cell by the arms 10, 14 of the cross-shaped part of the gate of that unit cell;
- each outer source region 23 is separated from an inner drain region 20 in the same quadrant by the loop-shaped part 18 of the gate in that quadrant;
- each outer source region 23 is separated from the outer drain regions 21 in the two nearest neighbour quadrants of that unit cell by the arms 10, 14 of the cross-shaped part of the gate of that unit cell;

and correspondingly in which:

- each inner drain region 20 is separated from an outer source region 23 in the same quadrant by the loop-shaped part 18 of the gate in that quadrant;
- each inner drain region 20 is separated from the inner source regions 22 in the two nearest neighbour quadrants of that unit cell by the arms 10, 14 of the cross-shaped part of the gate of that unit cell;
- each outer drain region 21 is separated from an inner source region 22 in the same quadrant by the loop-shaped part 18 of the gate in that quadrant;
- each outer drain region 21 is separated from the outer source regions 23 in the two nearest neighbour quadrants of that unit cell by the arms 10, 14 of the cross-shaped part of the gate of that unit cell.

This arrangement of the source and drain regions of the unit cells can allow the effective size of the gate to be increased within the area of the unit cell.

In examples in which the device includes a plurality of unit cells arranged in an array, nearest neighbour units cells in the array may be rotated with respect to each other by ninety degrees when viewed from above the major surface 2. An example of this can be seen in FIG. 3, in which the unit cells in the top left and bottom right corners of the array are rotated by ninety degrees compared to the unit cells in the top right and bottom left corners of the array when viewed from above the major surface 2. This arrangement of nearest neighbour unit cells in the array may assist in electrically interconnecting the various features of the array.

Each unit cell of a semiconductor device according to an embodiment of this disclosure may include a plurality of connection members extending over the gate, source and drain for providing electrical connections to the source and drain. These connection members may, for instance be formed in the layers of a metallisation stack located above the major surface of the substrate. As is known in the art, metallisation stacks generally include one of more layers (often referred to as metal layers e.g. M1, M2, M3 . . . etc.) comprising patterned metal features embedded in dielectric, for forming electrical interconnections in an integrated circuit. These metal layers are typically separated in the stack by intervening dielectric layers (often referred to as via layers e.g. V1, V2, V3 . . . etc.). Vias filled with an electrically conductive material such as a metal are usually provided, which may extend vertically through the via layers to provide electrical interconnections between the patterned metal features in different metal layers in the stack.

The formation of an example of such a metallisation stack, with the aforementioned connection members located therein, is described below in relation to the present embodiment in FIGS. 4 to 7. The arrangements of the connection members in the example described below may be relatively compact, requiring fewer metal levels to implement than prior devices (for instance only two metal levels are used in the present embodiment).

Figure 4:
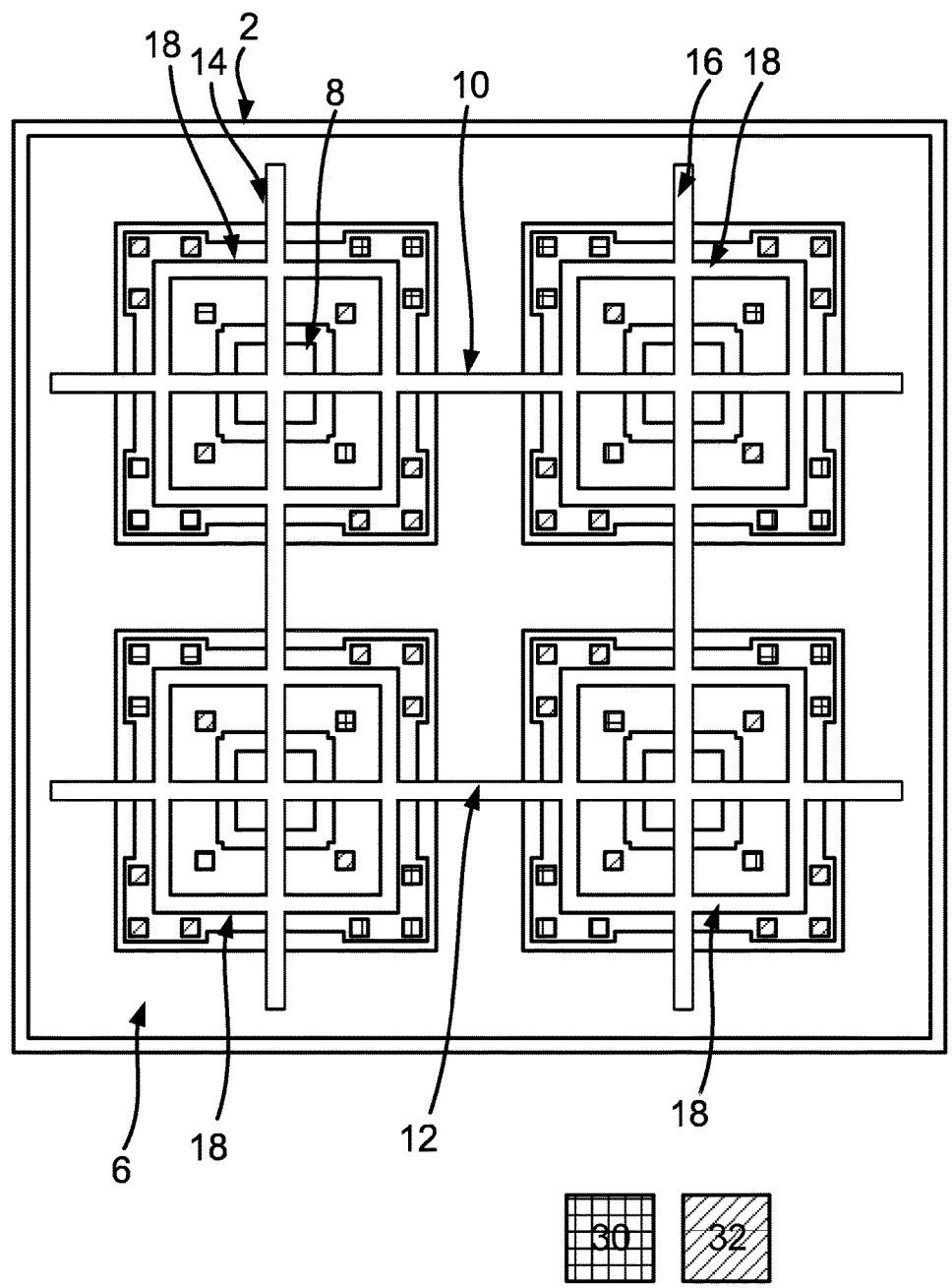

A next stage is shown in FIG. 4. In this stage, each unit cell of the device may be provided with one or more vias of the kind mentioned above, for connection to the source regions 22, 23 and drain regions 20, 21 of each unit cell. As shown in FIG. 4, in the present example, each inner source region 22 and outer source region 23 is provided with one or more vias 32, while each inner drain region 20 and outer drain region 21 is provided with one or more vias 30. These vias may interconnect the source and drain regions to patterned metal features located in a first (typically lowermost) metal layer of a metallisation stack located above the major surface 2 of the semiconductor substrate.

A next stage is shown in FIG. 5. In this stage, each unit cell of the device may be provided with one or more drain connection members. These drain connection members typically may be located in the lowermost metal layer (M1) of the metallisation stack, with the source connection members described below in relation to FIG. 7 being located in the next metal layer up (M2). However, it is envisaged that this arrangement may be reversed, with the source connection members being provided in M1 and the drain connection members being provided in M2. Indeed, it is envisaged that the source and drain connection members need not be located in metal layers M1 or M2 and may be located in different metal layers, e.g. higher up in the stack.

In the present example, the drain connection member(s) of each unit cell connect to the underlying drain regions through the vias 30 discussed above in relation to FIG. 4.

In this example, the drain connection member(s) of each unit cell may include an inner drain connection member 46. In the present example, the inner drain connection member 46 of each unit cell extends diagonally across that unit cell and interconnects the inner drain regions 20 of that unit cell. The drain connection member(s) may also include one or more a drain connection members 48 that extend across the substantially loop-shaped part 18 of the gate when viewed from above the major surface 2 of the semiconductor substrate. The drain connection members 48 may interconnect an inner drain region 20 of a unit cell to an outer drain region 21 of that unit cell. Note that where each unit cell is provided with multiple drain connection members 48, these may themselves be interconnected by the inner drain connection member 46 as shown in FIG. 5. The drain connection member(s) may also include one or more edge connection members 40, to allow the drain connection members located in each unit cell to be connected to the drain connection members in neighboring unit cells in the array. As shown in FIG. 5, in the present example, these edge connection members 40 may extend outwardly from the corner regions of each unit cell to connect to the corresponding edge connection members 40 of other unit cells in the array.

In the present example, metal layer M1 may also include one or more patterned metal features acting as a bridge between the underlying source regions and the source connection members located in the next metal layer M2. These bridge features may connect to the underlying source regions through the vias 32 discussed above in relation to FIG. 4. The bridge features may include inner islands 44 located above the inner regions of each quadrant of each unit cell, for connecting to the underlying inner source regions 22, and outer islands (or corner islands) 44 located above the outer regions of each quadrant of each unit cell, for connecting to the underlying outer source regions 23.

A next stage is shown in FIG. 6. In this stage, each unit cell of the device may be provided with one or more further vias 52 of the kind mentioned above, for connection of the source connection members in metal layer M2 to the underlying bridge features 42, 44, which are themselves connected to the underlying regions. The vias 52 may extend vertically between metal layer M1 and metal layer M2. The vias 52 may be located directly above the vias 32 shown in FIG. 4. It is envisaged that the bridge features may be omitted, and that the source connection members may be connected by uninterrupted vias passing down through the metallisation stack to reach the major surface 2 of the semiconductor substrate.

A next stage is shown in FIG. 7. In this stage, each unit cell of the device may be provided with one or more source connection members. These source connection members may be located in the metal layer (e.g. M2) of the metallisation stack (e.g. directly) above the layer in which the drain connection members are provided (although as mentioned previously, this arrangement may be reversed).

In the present example, the source connection member(s) of each unit cell connect to the underlying source regions through the vias 52, bridge features 42, 44 and vias 32 described above in relation to FIGS. 4 to 6.

In this example, the source connection member(s) of each unit cell may include an inner source connection member 56. In the present example, the inner source connection member 56 of each unit cell extends diagonally across that unit cell and interconnects the inner source regions 22 of that unit cell. The source connection member(s) may also include one or more a source connection members 58 that extend across the substantially loop-shaped part 18 of the gate when viewed from above the major surface 2 of the semiconductor substrate. The source connection members 58 may interconnect an inner source region 22 of a unit cell to an outer source region 23 of that unit cell. Note that where each unit cell is provided with multiple source connection members 58, these may themselves be interconnected by the inner source connection member 56 as shown in FIG. 7. The source connection member(s) may also include one or more edge connection members 50, to allow the source connection members located in each unit cell to be connected to the source connection members in neighboring unit cells in the array. As shown in FIG. 7, in the present example, these edge connection members 50 may extend outwardly from the corner regions of each unit cell to connect to the corresponding edge connection members 50 of other unit cells in the array.

Note that the previously mentioned rotation of nearest neighbour unit cells in the array may facilitate correct interconnection of the source and/or drain connection members described above, at the edge and/or corners of the unit cells (e.g. by the edge connection members 40 and the edge connection members 50).

From FIG. 7 it can be seen the source and drain connection members in the present example have very little overlap when viewed from above the major surface. This can help to minimise coupling between these metal features, which may improve the performance of the device. For instance, Reducing the overlap between the source and drain connection members may reduce the impact of parasitic capacitance and thus reduce the impact on Coff.

For instance, from FIG. 7 it can be seen that the edge connection members 40 and the edge connection members 50 are located in different corners of each unit cell, to keep them physically separated. From FIG. 7 it can also be seen that there is no overlap between the drain connection members 48 and the source connection members 58. As noted above, the inner source connection member 46 and the inner drain connection member 56 each extend diagonally across the unit cell. This may cause the inner source connection member 46 and the inner drain connection member 56 to overlap at the center of the unit cell as shown in FIG. 7. Nevertheless, in order to minimise coupling between the inner source connection member 46 and the inner drain connection member 56, the inner source connection member 46 and the inner drain connection member 56 may extend in orthogonal directions across the unit cell.

From FIG. 7 it can further be seen that in examples that include a plurality of unit cells arranged in an array, the edge connection members 40, 50 located at the outside edges of the array may be used to make electrical connections to the array, for applying voltages to the source and drain regions of each unit cell.

Note that in the present example, because the arms 10, 14 of the cross-shaped parts of the gates of the unit cells are interconnected at the edges of each unit cell, the grid formed by the arms 10, 14 in the array of unit cells need not necessarily be provided with connection members that extend over the unit cells in the way that the source and drain connections members do. Instead, it is envisaged that electrical connections to the grid formed by the arms 10, 14 may be made at the edges of the array. This may simplify the design of the metallisation stack, making more room available in the stack for the source and drain connection members, and may also reduce gate-to-source and gate-to-drain capacitance.

Accordingly, there has also been described a semiconductor device comprising a switch and a method of making the same. The device, has a layout having one or more rectangular unit cells. Each unit cell includes a gate having a substantially cross-shaped part comprising four arms that divide the unit cell into quadrants; and a substantially loop-shaped part, wherein a center of the cross-shaped part is located inside the loop-shaped part, and wherein the loop-shaped part intersects each arm of the cross-shaped part to divide each quadrant into an inner region located inside the loop-shaped part; and an outer region located outside the loop-shaped part. Each unit cell also includes a substantially loop-shaped active region forming a source and drain of the switch. First and second parts of the loop-shaped active region located in respective first and second diagonally opposite quadrants of the unit cell each include an inner source region located inside the loop-shaped part of the gate and an outer drain region located on an outer side of the loop-shaped part of the gate. Third and fourth parts of the loop-shaped active region located in respective third and fourth diagonally opposite quadrants of the unit cell each include an inner drain region located inside the loop-shaped part of the gate and an outer source region located on an outer side of the loop-shaped part of the gate. Each unit cell further includes a plurality of connection members extending over the gate, source and drain for providing electrical connections to the source and drain.

Although particular embodiments of this disclosure have been described, it will be appreciated that many modifications/additions and/or substitutions may be made within the scope of the claims.

The invention claimed is:

1. A semiconductor device comprising a switch, the device having a layout comprising one or more rectangular unit cells, each unit cell comprising:
   a gate comprising:
     a substantially cross-shaped part comprising four arms that divide the unit cell into quadrants; and
     a substantially loop-shaped part, wherein a center of the cross-shaped part is located inside the loop-shaped part, and wherein the loop-shaped part intersects each arm of the cross-shaped part to divide each quadrant into:
       an inner region located inside the loop-shaped part; and
       an outer region located outside the loop-shaped part;
   a substantially loop-shaped active region forming a source and drain of the switch,
   wherein first and second parts of the loop-shaped active region located in respective first and second diagonally opposite quadrants of the unit cell each include an inner source region located inside the loop-shaped part of the gate and an outer drain region located on an outer side of the loop-shaped part of the gate,
   wherein third and fourth parts of the loop-shaped active region located in respective third and fourth diagonally opposite quadrants of the unit cell each include an inner drain region located inside the loop-shaped part of the gate and an outer source region located on an outer side of the loop-shaped part of the gate; and
   a plurality of connection members extending over the gate, source and drain for providing electrical connections to the source and drain.

2. The semiconductor device claim 1, wherein each unit cell further includes trench isolation.

3. The semiconductor device of claim 2, wherein the trench isolation of each unit cell comprises an island located inside the loop-shaped active region, beneath the center of the cross-shaped part of the gate.

4. The semiconductor device of claim 1, wherein the trench isolation of each unit cell comprises a loop-shaped trench extending around a periphery of the unit cell completely to enclose the loop-shaped active region of the unit cell when viewed from above a surface on which the unit cell is located.

5. The semiconductor device of claim 1, wherein each unit cell comprises at least one of:
   an inner source connection member that extends diagonally across the unit cell electrically to interconnect the inner source regions of the loop-shaped active region; and
   an inner drain connection member that extends diagonally across the unit cell electrically to interconnect the inner drain regions of the loop-shaped active region.

6. The semiconductor device of claim 5, wherein the source connection member and the drain connection member cross each other at a center of the unit cell when viewed from above a surface on which the unit cell is located.

7. The semiconductor device of claim 1, wherein each unit cell comprises at least one of:
   a source connection member that extends across the substantially loop-shaped part of the gate when viewed from above a surface on which the unit cell is located, to connect an inner source region of the unit cell to an outer source region of the unit cell; and
   a drain connection member that extends across the substantially loop-shaped part of the gate when viewed from above a surface on which the unit cell is located, to connect an inner drain region of the unit cell to an outer drain region of the unit cell.

8. The semiconductor device of claim 1, wherein the connection members comprise metal features of a metallisation stack located above the gate, source and drain.

9. The semiconductor device of claim 1, having a layout comprising a plurality of unit cells arranged in an array.

10. The semiconductor device of claim 9, wherein the arms of the gate of each unit cell connect with corresponding arms of the gates of neighbouring unit cells in the array at the edges of each unit cell.

11. The semiconductor device of claim 9, wherein nearest neighbour unit cells of the array are rotated with respect to each other by ninety degrees when viewed from above a surface on which the unit cells are located.

12. The semiconductor device of claim 9, wherein the plurality of connection members of each unit cell connect to connection members of neighbouring unit cells at the edges of the unit cells when viewed from above a surface on which the unit cells are located.

13. The semiconductor device of claim 12, wherein source connection members and/or drain connection members of each unit cell connect with source connection members and/or drain connection members of neighbouring unit cells at the corners of the unit cells.

14. A Radio Frequency (RF) circuit comprising a semiconductor device according to claim 1.

15. A method of making a semiconductor device comprising a switch, the method comprising forming at least one rectangular unit cell of the switch by:
   providing a semiconductor substrate;
   forming a gate on the substrate, the gate comprising:
     a substantially cross-shaped part comprising four arms that divide the unit cell into quadrants; and
     a substantially loop-shaped part, wherein a center of the cross-shaped part is located inside the loop-shaped part, and wherein the loop-shaped part intersects each arm of the cross-shaped part to divide each quadrant into:
       an inner region located inside the loop-shaped part; and
       an outer region located outside the loop-shaped part;
   forming a substantially loop-shaped active region to form a source and drain of the switch;
   wherein first and second parts of the loop-shaped active region located in respective first and second diagonally opposite quadrants of the unit cell each include an inner source region located inside the loop-shaped part of the gate and an outer drain region located on an outer side of the loop-shaped part of the gate, and wherein third and fourth parts of the loop-shaped active region located in respective third and fourth diagonally opposite quadrants of the unit cell each include an inner drain region located inside the loop-shaped part of the gate and an outer source region located on an outer side of the loop-shaped part of the gate; and forming a plurality of connection members extending over the gate, source and drain for providing electrical connections to the source and drain.

\* \* \* \* \*